United States Patent
El Rifai et al.

(10) Patent No.: US 8,383,441 B2
(45) Date of Patent: Feb. 26, 2013

(54) METHOD FOR MANUFACTURING A MICROMACHINED DEVICE AND THE MICROMACHINED DEVICE MADE THEREOF

(75) Inventors: Joumana El Rifai, Cairo (EG); Ann Witvrouw, Herent (BE); Ahmed Abdel Aziz, Cairo (EG); Sherif Sedky, Sheikh Zaid (EG)

(73) Assignees: IMEC, Leuven (BE); American University Cairo, Cairo (EG); Katholieke Universiteit, Leuven (BE)

( * ) Notice: Subject to any disclaimer, the term of this patent is extended or adjusted under 35 U.S.C. 154(b) by 70 days.

(21) Appl. No.: 13/010,923

(22) Filed: Jan. 21, 2011

(65) Prior Publication Data

US 2011/0180886 A1 Jul. 28, 2011

Related U.S. Application Data

(60) Provisional application No. 61/297,392, filed on Jan. 22, 2010.

(51) Int. Cl.
*H01L 21/00* (2006.01)

(52) U.S. Cl. .......... 438/52; 257/415; 257/E21.497; 257/E29.324

(58) Field of Classification Search .......... 438/52; 257/415, E21.497, E29.324
See application file for complete search history.

(56) References Cited

U.S. PATENT DOCUMENTS

| | | | |
|---|---|---|---|
| 4,475,955 A | 10/1984 | Patel | |
| 6,922,272 B1* | 7/2005 | de Groot et al. | 359/291 |
| 2002/0192914 A1 | 12/2002 | Kizilyalli et al. | |
| 2004/0263703 A1* | 12/2004 | You | 349/42 |
| 2005/0048706 A1 | 3/2005 | Shimomura et al. | |
| 2005/0277236 A1 | 12/2005 | Shimomura et al. | |
| 2008/0057618 A1 | 3/2008 | Honda et al. | |
| 2011/0068342 A1* | 3/2011 | Afentakis et al. | 257/66 |

FOREIGN PATENT DOCUMENTS

| | | |
|---|---|---|
| EP | 1801067 | 6/2007 |
| JP | 58026094 | 2/1983 |

* cited by examiner

*Primary Examiner* — Kimberly Rizkallah
*Assistant Examiner* — Timor Karimy
(74) *Attorney, Agent, or Firm* — McDonnell Boehnen Hulbert & Berghoff LLP

(57) ABSTRACT

Methods for manufacturing micromachined devices and the devices obtained are disclosed. In one embodiment, the method comprises providing a structural layer comprising an amorphous semiconductor material, forming a shielding layer on a first portion of the structural layer and leaving exposed a second portion of the structural layer, and annealing the second portion using a first fluence. The method further comprises removing the shielding layer, and annealing the first portion and the second portion using a second fluence that is less than half the first fluence. In an embodiment, the device comprises a substrate layer, an underlying layer formed on the substrate layer, and a sacrificial layer formed on only a portion of the underlying layer. The device further comprises a structural layer that is in contact with the underlying layer and comprises a first region annealed using a first fluence and a second region annealed using a second fluence.

17 Claims, 12 Drawing Sheets

METHOD FOR MANUFACTURING A MICROMACHINED DEVICE AND THE MICROMACHINED DEVICE MADE THEREOF

CROSS-REFERENCE TO RELATED APPLICATIONS

This application claims priority to U.S. Provisional Application 61/297,392 filed Jan. 22, 2010, the contents of which are incorporated by reference herein in their entirety.

BACKGROUND OF THE INVENTION

1. Field of the Invention

The present invention relates to methods for manufacturing micromachined devices and in particular methods for manufacturing structural silicon germanium layers having contact regions with low electrical resistivity and low strain gradient suspended regions suitable for the formation of micromachined devices.

2. Description of the Related Technology

In the past years, the need for integrating Micro Electro Mechanical Systems (MEMS) (or also referred to as micromachined devices) with prefabricated Complementary Metal Oxide Semiconductor (CMOS) electronics to produce compact and improved devices has set some limitations on the processing temperature of the active MEMS material. Post-processing monolithic integration requires reduced maximum processing temperatures in the range of, for example, 420 to 520° C.

Polycrystalline silicon germanium is an attractive material for MEMS post-processing, as it allows good electrical, mechanical and thermal properties at temperatures that are lower than the temperatures required for polycrystalline silicon processing.

However, emerging interest in fabricating MEMSs on temperature sensitive substrates, such as passive and flexible substrates, requires further reduction of the processing temperature of the active or structural layers. Using substrate materials such as benzocyclobutene (BCB), silicone, polymide (PI) or polyethylene terephthalate (PET) may limit the maximum processing temperature to, for example, 300° C. or lower.

There is thus a continuous need for further reduction of the processing temperature of polycrystalline silicon germanium structural layers.

In EP 1 801 067 A2, a method for manufacturing structural silicon germanium layers for surface machined MEMS devices at temperatures substantially below 400° C. is disclosed. The method comprises deposition of amorphous silicon germanium (a-SiGe) at a temperature below 400 degrees Celsius using plasma enhanced chemical vapor deposition (PECVD). However, the as-deposited a-SiGe has degraded electrical and mechanical properties, including high stress, strain gradient and electrical resistivity, all of which are not acceptable for functional and reliable MEMS structural layers. The method further comprises a laser annealing step with restricted laser fluences for improving the mechanical properties (stress and/or strain) of the as-deposited a-SiGe. By using the restricted laser fluences, a low strain gradient can be achieved. However, the structural layers thus obtained have high sheet resistance. It is suggested that by further tuning of the parameters of the as-deposited a-SiGe (for example increasing the germanium (Ge) content) and by using a higher number of laser pulses a lower resistivity may be achieved. However a high Ge content is not fully compatible with standard CMOS processing. Moreover a high Ge content may affect device reliability.

Thus, there remains a need for further reduction of the processing temperature of polycrystalline silicon germanium structural layers without degradation to the electrical and mechanical properties.

SUMMARY OF CERTAIN INVENTIVE ASPECTS

Disclosed herein is a method for manufacturing a micromachined device (MEMS device) at temperatures below 400° C., independent of the driving electronics fabrication process and the substrate type used.

In some embodiments, the method may be a method for forming an optimized structural layer with optimized electrical properties (low resistivity, e.g. below 3.4 mΩ·cm) for one part of the structural layer and optimized mechanical properties (low strain gradient, e.g. below $6.8 \times 10^{-6}$ $\mu m^{-1}$) for another part of the structural layer.

In some embodiments, the method may be a method for forming an optimized structural layer with a predetermined strain gradient for one part of the structural layer and a predetermined resistivity for another part of the structural layer.

Particular aspects of the invention are set out in the accompanying independent and dependent claims. Features from the dependent claims may be combined with features of the independent claims and with features of other dependent claims as appropriate and not merely as explicitly set out in the claims.

Other advantages of the invention will be immediately apparent to those skilled in the art from the following description.

DETAILED DESCRIPTION OF CERTAIN ILLUSTRATIVE EMBODIMENTS

Figure 1A:
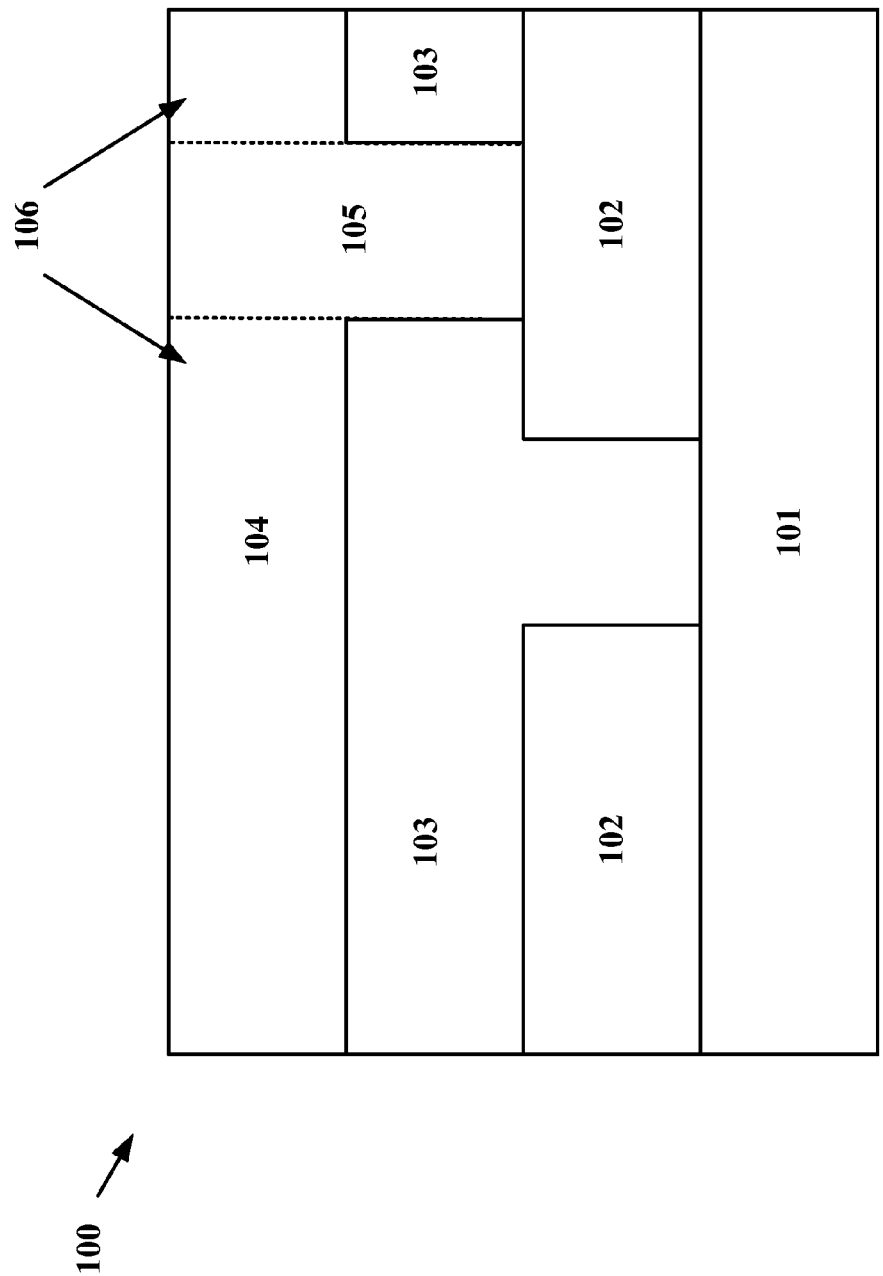
FIGS. 1A-1F illustrate a method of forming a microelectromechanical device in accordance with an embodiment.

Overview of the Method and the Device

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention. Any reference signs in the claims shall not be construed as limiting the scope. In the different drawings, the same reference signs refer to the same or analogous elements.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Furthermore, while some embodiments described herein include some but not other features included in other embodiments, combinations of features of different embodiments are meant to be within the scope of the invention, and form different embodiments, as would be understood by those in the art.

The disclosure is related to method for manufacturing a micromachined device and will now be explained in more detail with reference to particular embodiments, the present invention not being limited thereto but only being limited by the claims.

FIGS. 1A-1F illustrate a method of forming a microelectromechanical device in accordance with an embodiment. As shown in FIG. 1A, the stack 100 includes a substrate layer 101, an underlying layer 102, a sacrificial layer 103, and a structural layer 104.

In some embodiments, the structural layer 104 may comprise an amorphous semiconductor material. The structural layer 104 may be provided by means of a plasma enhanced chemical vapor deposition (PECVD) process. Providing the structural layer may be performed at a temperature below 400° C.

As shown in FIG. 1A, a portion 105 of the structural layer 104 is in contact with the underlying layer 102, while a remaining portion 106 of the structural layer 104 is not in contact with the underlying layer 102. In other words, the portion 105 of the structural layer is anchored to the underlying layer 102, while the remaining portion 106 of the structural layer 104 is suspended. Thus the portion 105 may be referred to as the anchored portion 105, and the remaining portion 106 may be referred to as the suspended portion 106. In embodiments where the stack 100 is an MEMS device, the structural layer 104 may comprise flexible beam, which may comprise both an anchored portion 105 and a suspended portion 106.

In some embodiments, it may be desirable for the suspended portion 106 of the structural layer 104 to have a low strain gradient, where the strain gradient is the positive difference in the strain between the top and the bottom of the suspended region of the structural layer 104 divided by its thickness. Example values of a desirable strain gradient may be below $6.8 \times 10^{-6}$ $\mu m^{-1}$. Other strain gradients are possible as well.

In some embodiments, it may be desirable for the anchored portion 105 of the structural layer 104 to have a low electrical resistivity. Example values for a desirable electrical resistivity may be below 3.4 mΩ·cm. Other electrical resistivities are possible as well.

Figure 1B:
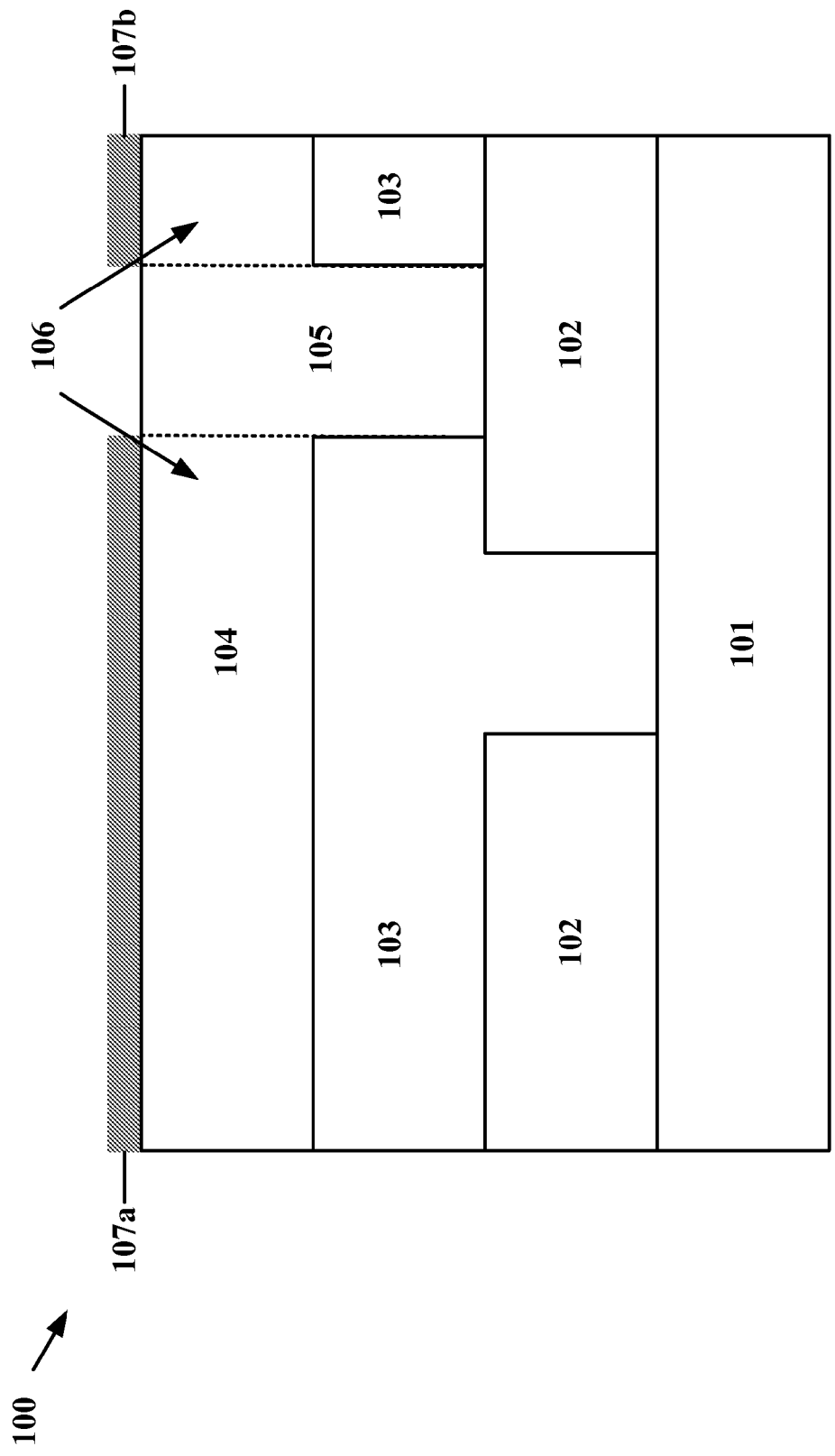

In FIG. 1B, a shielding layer 107 is provided on the structural layer 104 in the suspended region 106 of the structural layer 104, while no shielding layer is provided in the anchored region 105 of the structural layer 104.

The shielding layer 107 may serve as a protective barrier for the suspended portion 106 of the structural layer 104. In particular, with the shielding layer 107 present, any thermal treatment, such as an anneal, performed on the structural layer 104 will not substantially affect the suspended portion 106 of the structural layer 104. In particular, one or more electrical and/or mechanical properties of the suspended portion 106 of the structural layer 104 may be preserved during a thermal treatment due to the presence of the shielding layer 107. However, such a thermal treatment will affect the portion of the structural layer 104 not protected by the shielding layer 107, namely, the anchored portion 105.

In some embodiments, the shielding layer 107 may comprise a material that can withstand high thermal fluences without experiencing any drastic changes or deterioration. Examples of high thermal fluences may include, for example, fluences greater than 600 mJ/cm$^2$ or 6000 pulses at a laser fluence of 960 mJ/cm$^2$.

Alternately or additionally, the shielding layer 107 may comprise a reflective material, such as aluminum. The reflectance of the shielding layer 107 may be, for example 90%. Other reflective materials and reflectances are possible as well.

Figure 1C:
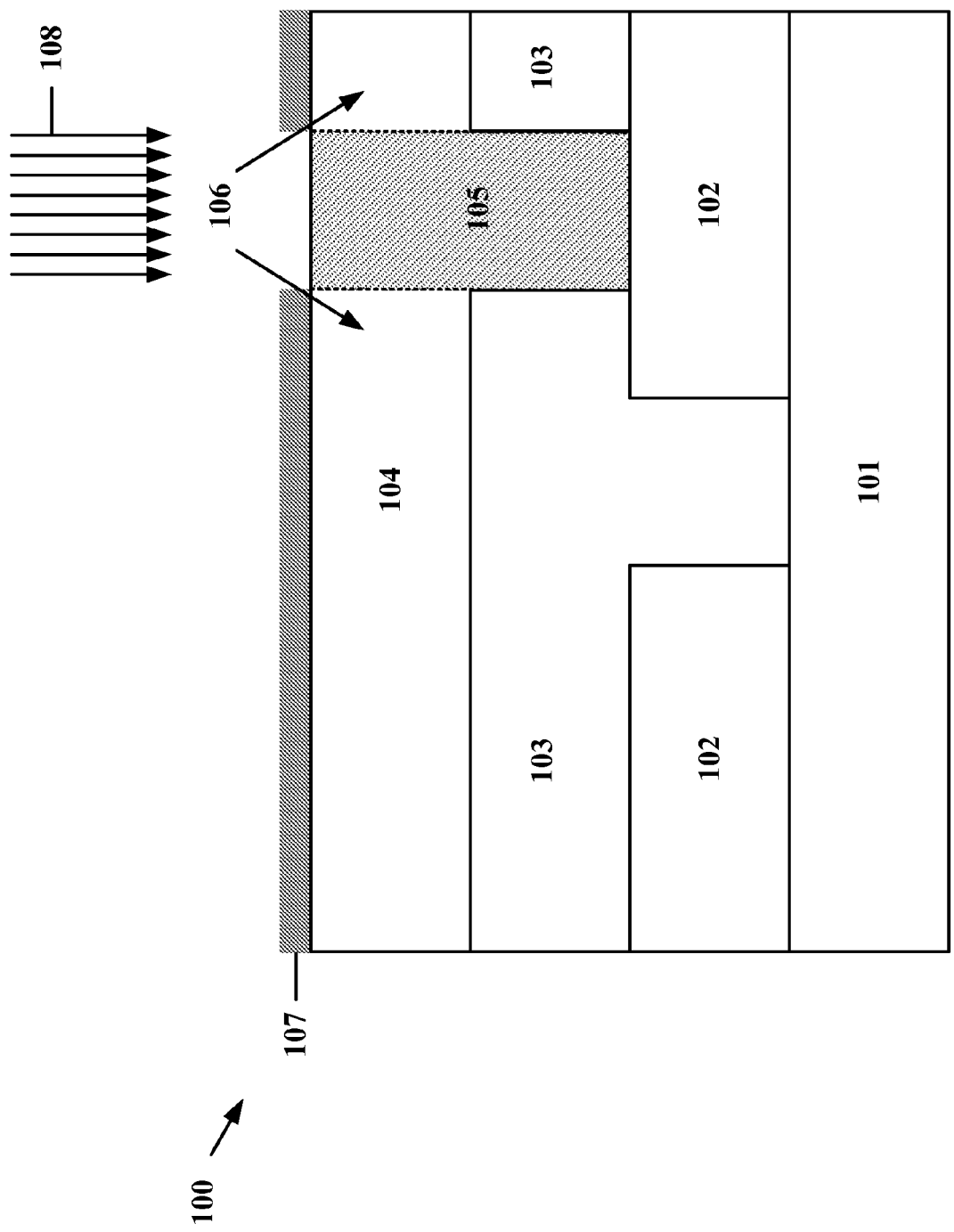

In FIG. 1C, the anchored portion 105 of the structural layer 104 is annealed by means of a first fluence 108. In some embodiments, annealing the anchored portion 105 of the structural layer 104 may involve converting at least a portion of the structural layer 104 into a crystalline material (as shown by the diagonal line pattern). As noted above, the structural layer 104 may, in some embodiments, comprise amorphous semiconductor material. For example, the structural layer 104 may comprise amorphous silicon germanium (a-SiGe). Upon annealing the anchored portion 105 of the structural layer 104, at least a portion of the a-SiGe may be converted into crystalline material, such as poly-SiGe.

In some embodiments, the amorphous semiconductor material may be substantially completely converted into crystalline semiconductor material. In some instances, this may result in a lower electrical resistivity and larger crystallization depth. In some embodiments, the crystallization depth in the anchored portion 105 of the structural layer 104 may be less than or equal to the thickness of the structural layer 104.

In some embodiments, annealing the anchored portion 105 of the structural layer 104 may involve performing a laser anneal, and the first fluence 108 may be a first laser pulse fluence 108. Example process parameters of the anneal may include a first laser pulse fluence 108, a first number of laser pulses and a first pulse repetition rate.

Example values for the first laser pulse fluence 108 may be greater than 600 mJ/cm$^2$, or may be between 600-1000 mJ/cm$^2$.

Example values for the first number of laser pulses may be between 1 and 1000, or may be between 1 and 500. In some embodiments, the number of laser pulses may be selected so as to decrease the crystallization depth. This may allow controlled tuning of strain gradient.

Example values of the first pulse repetition rate may be between 1 Hz and 50 Hz. In some embodiments, the pulse repetition rate may be selected so as to decrease the crystallization depth. This too may allow controlled tuning of the strain gradient.

In some embodiments, the anneal may involve a single pulse with a fluence between 600-1000 mJ/cm$^2$. Other examples are possible as well.

In some embodiments, the thermal penetration depth of the anneal may be limited to the structural layer 104.

Once annealed, the anchored portion 105 of the structural layer 104 may have a reduced electrical resistivity. However, the electrical resistivity of the suspended portion 106 of the structural layer 104 (protected by the shielding layer 107) may be substantially unchanged. In some embodiments, immediately after the anneal shown in FIG. 1C, the electrical resistivity of the anchored portion 105 may be, for example, greater than 99% lower than the electrical resistivity of the anchored portion 105 before the anneal shown in FIG. 1C. Other examples are possible as well.

Figure 1D:
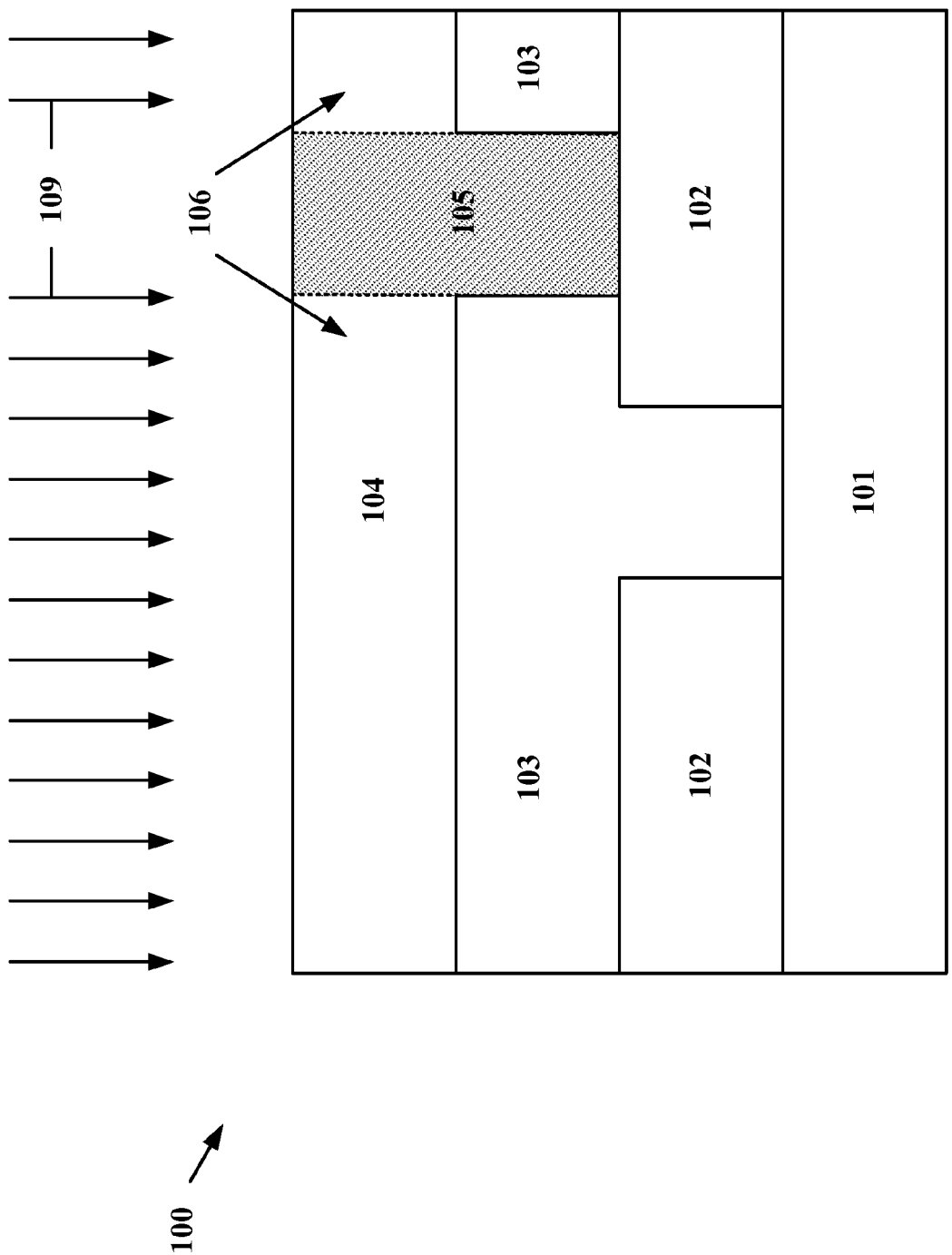

In FIG. 1D, two steps are shown. First, the shielding layer 107 is removed. Removing the shielding layer 104 may be done in any suitable way, such as by performing a chemical etching step. Other examples are possible as well.

Once the shielding layer 107 is removed, the suspended portion 106 of the structural layer 104 is annealed by means of a second fluence 109. In some embodiments, the anneal may be a laser anneal, and the second fluence 109 may be a second laser pulse fluence 109. Example process parameters of the anneal may include a second laser pulse fluence 109, a second number of laser pulses and a second pulse repetition rate.

In some embodiments, the second laser pulse fluence 109 may be smaller than the first laser pulse fluence 108. For example, the second laser pulse fluence 109 may be between 1.5 and 2.4 times smaller than the first laser pulse fluence 108. As another example, if multiple pulses are used, the second laser pulse fluence 109 may be up to 4.6 times smaller than the first laser pulse fluence 108. Other examples are possible as well Example values of the second laser pulse fluence 109 may be smaller than 250 mJ/cm$^2$. In some embodiments, the smaller laser pulse fluence 109 may allow crystallization depth that is shallow enough to produce flat cantilevers.

Example values of the second number of laser pulses may be between 1 and 1000, or may be between 1 and 500.

Example values of the second pulse repetition rate may be between 1 Hz and 50 Hz.

In some embodiments, the second laser pulse fluence 109 may be lower than 250 mJ/cm$^2$ for single pulse and lower than 130 mJ/cm$^2$ for multiple pulse. In other embodiments, the second laser pulse fluence may be between 230-250 mJ/cm$^2$ for single pulse and may be between 80-130 mJ/cm$^2$ for multiple pulses, such as a number of pulses in the range from 100 to 1000 pulses.

While the second laser pulse fluence 109 is shown applied only to the suspended portion 106 of the structural layer 104, in some embodiments the second laser pulse fluence 109 may be applied to the anchored portion 105 as well. Indeed, in order to only apply the second laser pulse fluence 109 to the suspended portion 106 of the structural layer 104, a second shielding layer (not shown) would need to be applied over the anchored portion 105 of the structural layer 104.

In embodiments where the second laser pulse fluence 109 is substantially smaller than the first laser pulse fluence 108 applied to the anchored portion 105 of the structural layer 104, the second laser pulse fluence 109 may not have a substantial effect on the anchored portion 105 (even if no shielding layer is present). In particular, the electrical resistivity of the anchored portion 105 may not be substantially changed after the anneal shown in FIG. 1D. However, after the anneal shown in FIG. 1D, the strain gradient of the suspended portion 106 may be decreased as compared to before the anneal shown in FIG. 1D. In some embodiments, the strain gradient may be decreased to a particular predetermined strain gradient by appropriately selecting one or more of the parameters of the anneal (including the second laser pulse fluence 109, the second number of laser pulses, and the second pulse repetition rate). For example, one or more of the parameters may be chosen such that an initial compressive stress from the structural layer 104 is reduced by the anneal. As another example, one or more parameters may be chosen such that an initial compressive stress of the structural layer 104 is converted to a low tensile stress by the anneal.

In some embodiments, the anneal shown in FIG. 1C may be a harsh laser annealing step, and anneal shown in FIG. 1D may be a soft laser annealing step.

By performing the steps shown in FIGS. 1A-1D, both electrical and mechanical properties of the structural layer 104 may be optimized for particular micromachined applications by varying one or more of the process parameters of the anneals.

As noted above, the anneal shown in FIG. 1C serves to optimize electrical properties of the anchored portion 105 of the structural layer 104. Similarly, the anneal shown in FIG. 1D serves to optimize the mechanical properties of the suspended portion 106 of the structural layer 104. Because the anchored portion 105 serves as an electrical contact, the electrical properties of the anchored portion 105 may be more important than the mechanical properties of the anchored portion 105. Indeed, were one to note the mechanical properties of the anchored portion 105 of the structural layer 104 after the anneal of FIG. 1C, one would note that a large tensile stress and strain gradient is present in the anchored portion 105. However, the large tensile stress and strain gradient present in the anchored portion 105 is not problematic, as the anchored portion is not suspended and thus can withstand such stress and strain.

In contrast, because the suspended portion 106 of the structural layer 104 is suspended, the mechanical properties of the suspended portion 106 may be more important than the electrical properties of the suspended portion 106. For this reason, the shielding layer 107 is used to protect the suspended portion 106 of the structural layer 104 during the anneal shown in FIG. 1C (which may disrupt the mechanical properties of the suspended portion 106). Further, were one to note the electrical properties of the suspended portion 106 of the structural layer 104 after the anneal of FIG. 1D, one would note that a high resistivity is present in the suspended portion 106. In particular, one may note that the resistivity of the suspended portion 106 is lower than that of the initial resistivity of the structural layer 104, but higher than that of the anchored portion 105. The laser fluence is proportional to the decrease in electrical resistivity. Thus, because the second laser pulse fluence 109 is smaller than the first laser pulse fluence 108, the electrical resistivity of the suspended portion 106 is higher than that of the anchored portion 105 after the anneals.

In this manner, the electrical properties of the anchored portion 105 are improved, while the mechanical properties of the suspended portion 106 are preserved.

In some embodiments, annealing the suspended portion 106 of the structural layer 104 may involve converting at least a portion of the structural layer 106 into a crystalline material (as shown by the diagonal line pattern). As noted above, the structural layer 104 may, in some embodiments, comprise amorphous semiconductor material. For example, the structural layer 104 may comprise amorphous silicon germanium (a-SiGe). Upon annealing the suspended portion 106 of the structural layer 104, at least a portion of the a-SiGe may be converted into crystalline material, such as poly-SiGe.

In some embodiments, only an upper portion of the structural layer 104 may be converted into a crystalline material. For example, the crystallization depth may be up to 200 nm. Other examples are possible as well.

One or both of the anneals may be performed using a pulsed excimer laser.

In general, after applying the anneal shown in FIG. 1C, the anchored portion 105 of the structural layer 104 may be characterized by a predetermined resistivity that is different from the initial resistivity. In some embodiments, the predetermined resistivity may be smaller than the initial resistivity. After applying the anneal shown in FIG. 1D, the suspended portion 106 of the structural layer 104 may be characterized by a predetermined strain gradient that is different from the initial strain gradient. In some embodiments, the predetermined strain gradient may be smaller than the initial strain gradient.

Figure 1E:
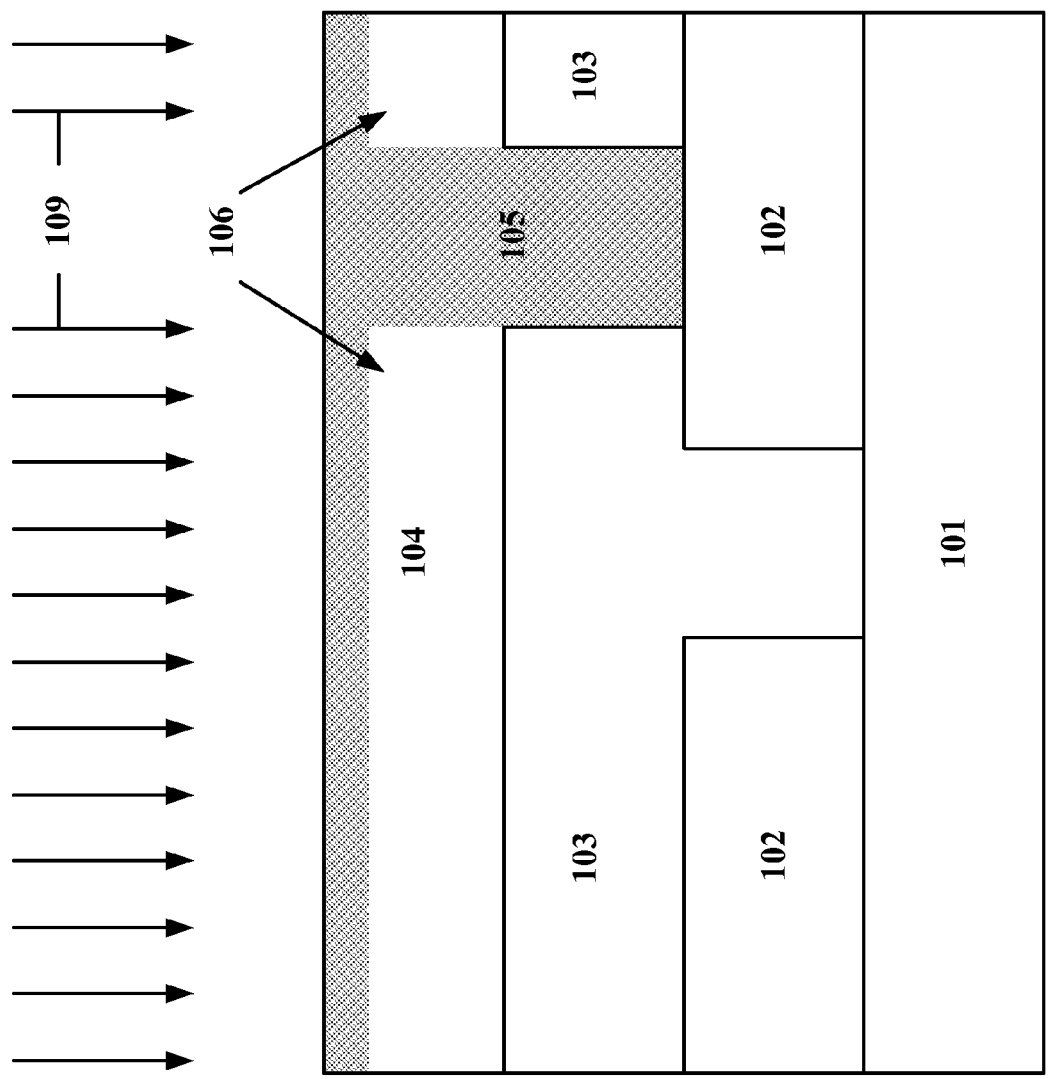
Figure 1F:
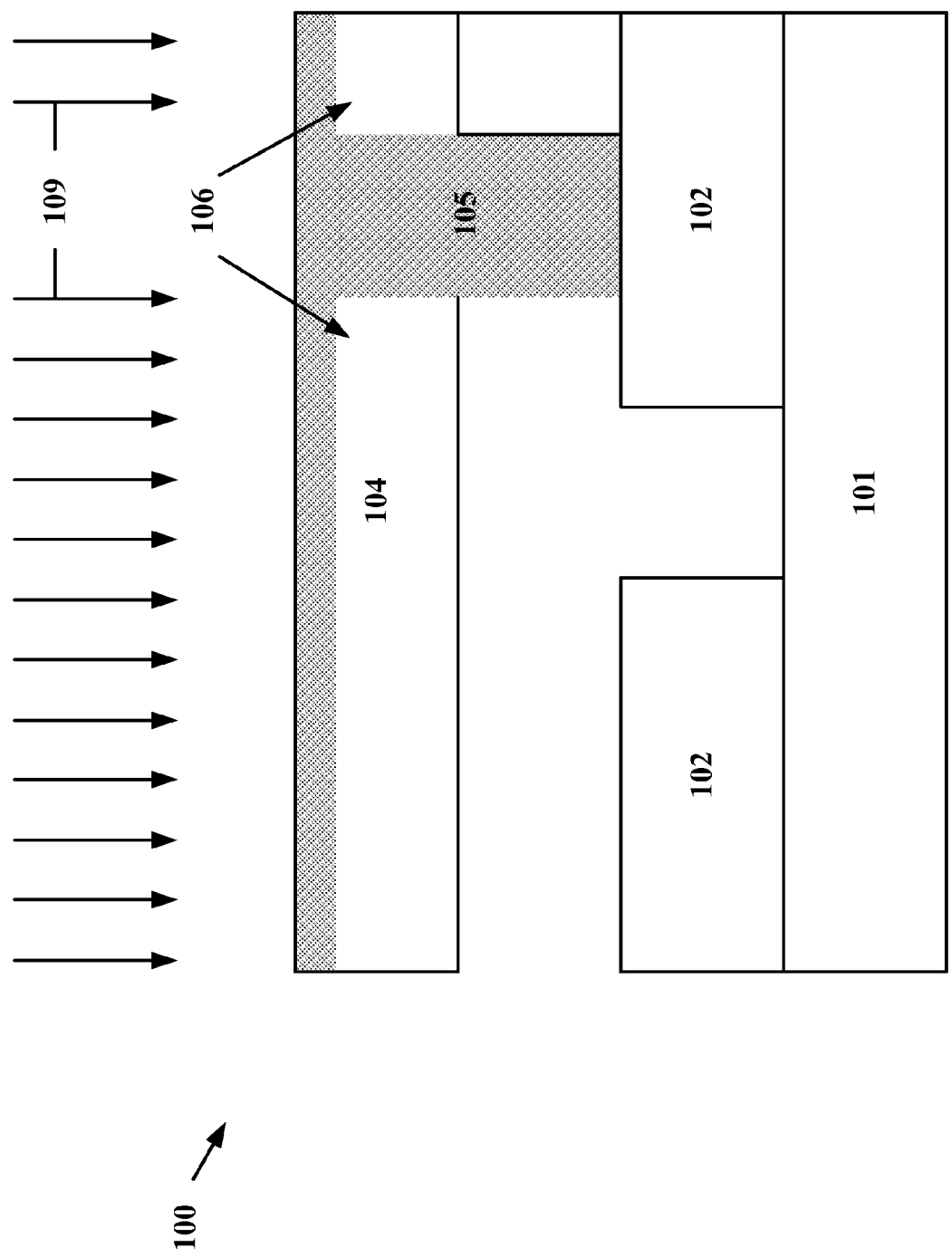

In FIG. 1E, the resulting structure 100 is shown. In some embodiments, once the annealing steps have been performed, the sacrificial layer 103 may be removed, such that a cavity is formed between the suspended portion 106 of the structural layer 104 and the underlying layer 102. These embodiments are shown in FIG. 1F.

The resulting structure 100, as shown in FIG. 1E, is similar to a cantilever. For the cantilever shown, the strain gradient may be given by $$\frac{2(\Delta x)}{L^2},$$

where $\Delta x$ is the deflection of the cantilever (as compared to a zeroed horizontal) and $L$ is the length of the cantilever. Other means of calculating the stress gradient are possible as well.

FIGS. 2A-2D illustrate various parts of a structural layer for a micromachined device. The substrate layer 201 is used as a support layer onto which multiple alternating layers of structural and sacrificial material are deposited and patterned to realize micromechanical structures.

Figure 2B:
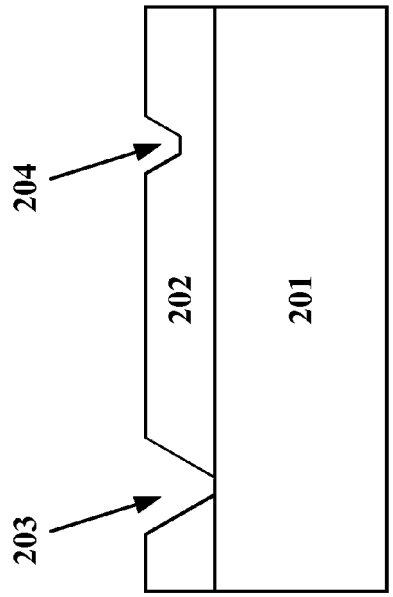
FIGS. 2A-2D illustrate various parts of a structural layer for a micromachined device.
Figure 2D:
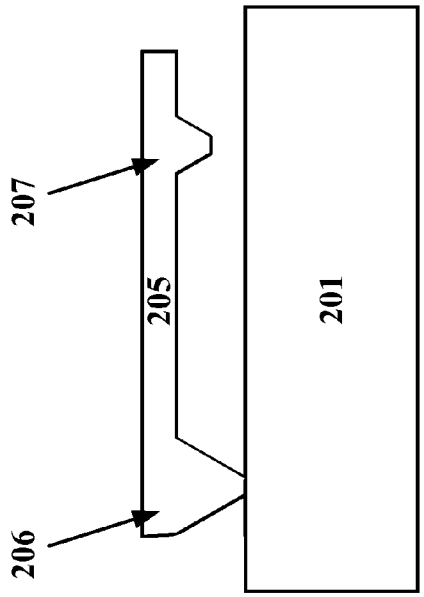
Figure 2A:
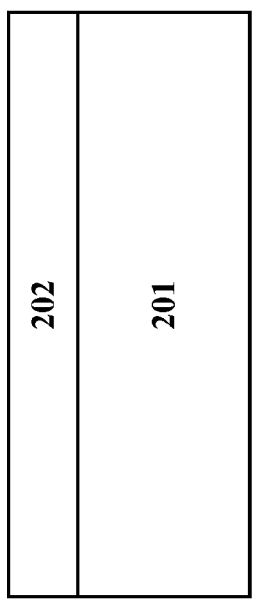

In particular, as shown in FIG. 2A, a sacrificial layer 202 is formed on the substrate layer 201. In FIG. 2B, the sacrificial layer 202 is patterned to create openings 203 and 204 in the sacrificial layer. It can be seen that the opening 203 penetrates to the underlying substrate layer 201, while the opening 204 does not.

Figure 2C:
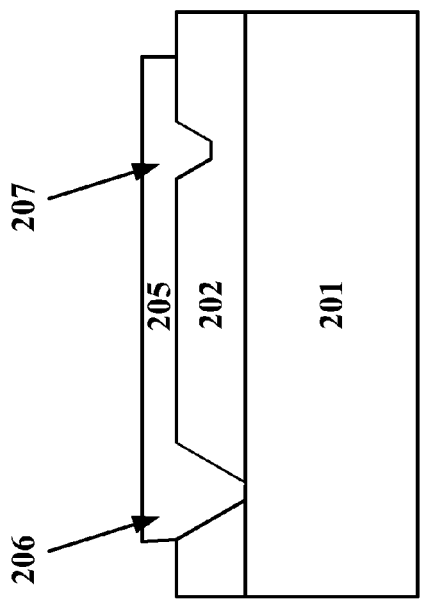

In FIG. 2C, a structural layer 205 is deposited on the sacrificial layer 202. The structural layer 205 may take several shapes. As shown, the structural layer 205 is patterned to be a freestanding beam. In particular, the structural layer 205 is patterned to include an anchored region 206 and a suspended region 207, as described above in connection with FIG. 1.

In FIG. 2D, the sacrificial layer 202 is removed, releasing the suspended portion 207 of the structural layer 205. As shown, the anchored portion 206 of the structural layer 205 remains connected to the underlying substrate 201.

Experimental Results

Figure 3:
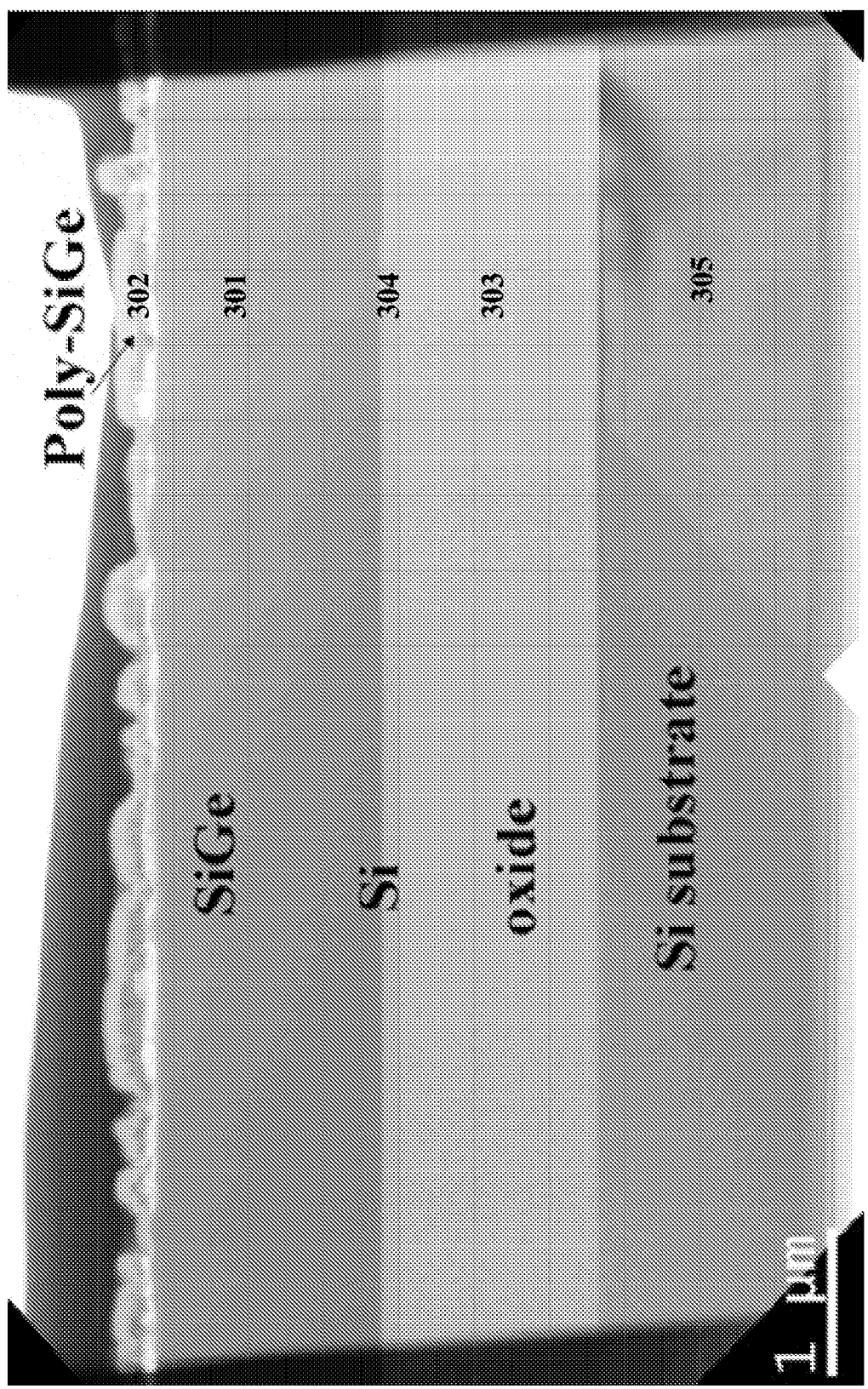
FIG. 3 shows a first transmission electron microscopy (TEM) image of a stack of layers with poly-SiGe after performing a thermal treatment in accordance with an embodiment.

FIG. 3 shows a first transmission electron microscopy (TEM) image of a stack of layers with poly-SiGe after performing a thermal treatment in accordance with an embodiment. In particular, the stack of layers shown in FIG. 3 includes PECVD SiGe layers which were prepared at 210° C. on Si wafers 905 covered with 2 μm $SiO_2$ 903. A 200 nm a-Si layer 904 was used in between the B-doped $Si_{72}Ge_{28}$ 901 and the 2 μm thick sacrificial oxide 903 for improved adhesion. For different experiments, the SiGe layers were 1.0, 1.6 and 1.8 μm thick.

The electrical and mechanical properties of the as grown amorphous and laser annealed layers were determined as follows. The sheet resistance and surface roughness was measured on blanket samples using a four-point probe and Dektak surface profiler, respectively. The strain gradient was determined from the cantilever out of plane deflection.

Laser crystallization on blanket and patterned samples was performed using a KrF Excimer laser (248 nm) with a 23 mm² spot size and a 24 ns pulse duration. Blanket samples underwent a harsh laser treatment to increase the crystallization depth and reduce the resistivity of the layers, while the laser fluence was restricted to a maximum of 120 mJ/cm² for the strain gradient optimization in patterned samples. An example harsh laser may have a fluence between, for example, 600 mJ/cm² and 1000 mJ/cm².

Additionally, patterned and blanket 1 μm Aluminum (Al) layers were used to investigate Al shielding properties under the harsh laser annealing (LA) conditions. The Al layers were deposited, by sputtering at room temperature, directly on a-SiGe. They were either patterned or left blanket and exposed to the laser beam. After treatment, surface roughness changes were monitored on the blanket Al layers to examine the layer's endurance to the harsh laser annealing conditions. For the patterned Al samples, the Al was removed after the laser treatment by a wet etch in diluted HF.

The underlying SiGe layer was then examined by SEM to detect visible changes between the exposed and unexposed SiGe. The SEM image is shown in FIG. 3. Additionally the sheet resistance and surface roughness were measured in both treated and untreated locations and compared to that of the as-grown a-SiGe and previously laser annealed poly-SiGe samples.

As-grown deposited layers were tuned to be highly compressive. The laser pulse shifted the stress to more tensile values, and layers with an initial high compressive stress had a higher limit for the maximum laser fluence. A low Ge concentration of 28% turned out to be more efficient in enduring harsh laser annealing conditions. Higher Ge concentrations lowered the material's melting point and therefore were more sensitive to slight variations in the laser pulse.

Films were initially amorphous with a minimum resistivity reading of $4.02 \times 10^3$ Ω·cm. The measured surface roughness of the as-grown layers ranged from 35.7 nm to 69.3 nm.

As-grown layers had an initial strain gradient such that 0.65 mm long beams have an out of plane deflection between 8.9 and 18.3 µm with tips touching the substrate.

Figure 4:
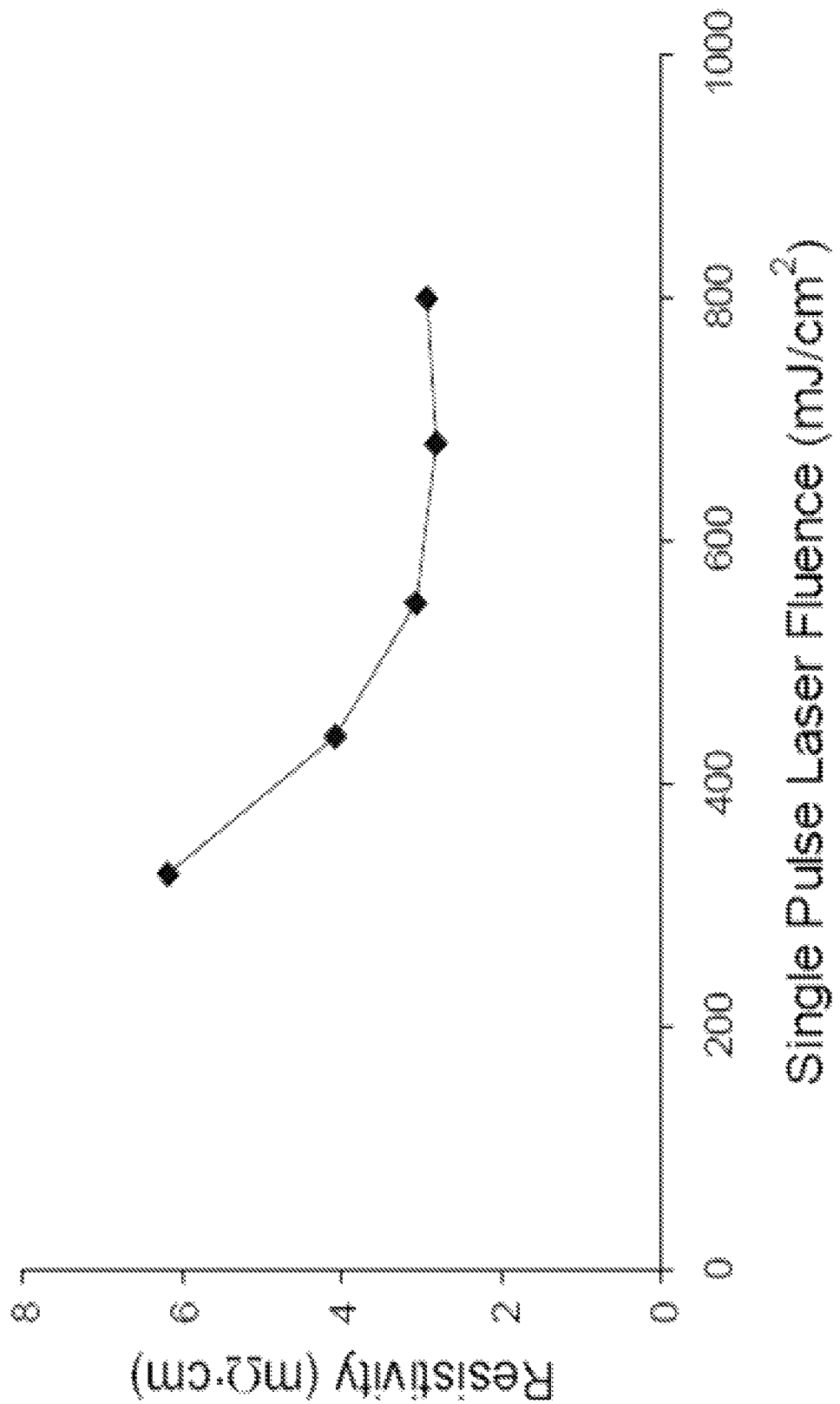
FIG. 4 shows a TEM image of a poly-SiGe layer after performing a thermal treatment in accordance with an embodiment.

FIG. 4 shows a resistivity versus single pulse laser fluence plot for a thermal treatment in accordance with an embodiment. As shown, increasing the laser fluence increases the crystallization depth and decreases the resistivity. In particular, FIG. 4 outlines the effect of a single pulse fluence on the resistivity of a $Si_{72}Ge_{28}$ sample.

As the energy supplied to the layer increases, the structural changes become deeper and more effective and the resistivity is reduced. As shown, a laser fluence of 680 mJ/cm² is sufficient to reduce the resistivity to a low value of 2.83 Ωm·cm with a surface roughness of 125.5 nm. The relations shown in the plot may be verified by a TEM image.

Figure 5:
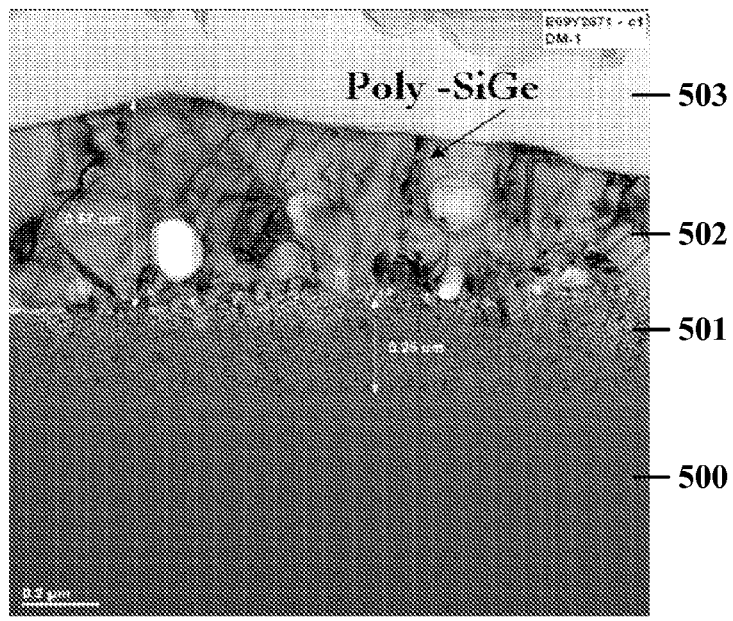
FIG. 5 shows an SEM image of a-SiGe layer after performing a thermal treatment in accordance with an embodiment.

FIG. 5 shows a TEM image of a poly-SiGe layer after performing a thermal treatment in accordance with an embodiment. In particular, FIG. 5 shows a TEM image of a poly-SiGe layer 502 achieved after performing a laser treatment to a 1.6 µm thick $Si_{72}Ge_{28}$ layer with a single fluence pulse of 680 mJ/cm².

A crystallization depth of approximately 0.6-1 µm is achieved. A variation in grain size is visible across the depth of the layer due to a temperature gradient during the laser annealing step. A layer of larger grains 502, about 0.57 µm deep, is measured, as well as a layer of finer grains 501, about 0.25 µm deep. The poly-SiGe layer is formed on a 200 nm a-Si layer (not clearly visible in FIG. 5, but as layer 304 in FIG. 3). The a-Si layer is formed on a 2 µm $SiO_2$ 500. However, such a harsh laser treatment on suspended structures would result in an excessive strain gradient and would degrade the material's mechanical properties. FIG. 5 furthermore shows a CVD oxide layer 503, which is added during TEM analysis to protect the sample during sample preparation.

For an optimized structural layer with both good electrical (low resistivity) (for the contact areas) and mechanical properties (low strain gradient) (for the suspended areas), higher laser fluences should be used on contacts to increase the crystallization depth and lower laser fluences should be applied in sections where the structures are suspended. This can be achieved by using a shielding material 104 to protect the suspended structures from the high fluence laser beam, as described above.

The selection of such a protective layer is challenging since this layer should withstand a high laser fluence without experiencing any drastic changes. Various trials to select an appropriate shielding material were conducted ($Si_3N_4$, thick photoresist, $SiO_2$ and Al), and Al presented the best results due to its high reflectivity. Aluminum can provide more than 90% reflectance.

An amorphous 1.6 µm SiGe layer with initial resistivity of $4.0\pm0.9\times10^3$ Ω·cm and surface roughness of 69.3 nm was protected with a patterned 1 µm thick Al layer. The sample was exposed to a 680 mJ/cm² laser treatment. The Al shield was removed by a wet etch in diluted HF and the sample was examined. In the unshielded sections exposed to the laser beam, the layer's resistivity dropped to 3.47 mΩ·cm while in the shielded sections it remained at a high value of $3.4\times10^3$ Ω·cm.

Figure 6:
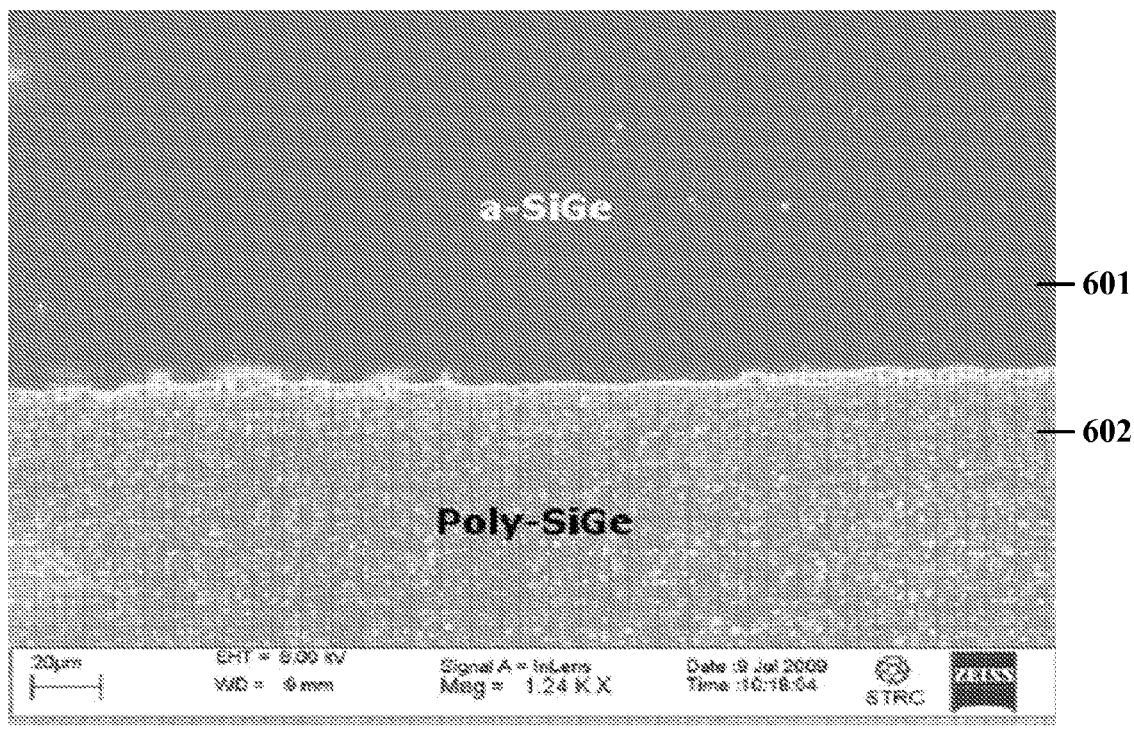
FIG. 6 shows a resistivity versus single pulse laser fluence plot for a thermal treatment in accordance with an embodiment.

FIG. 6 shows an SEM image of a-SiGe layer after performing a thermal treatment in accordance with an embodiment. In particular, FIG. 6 shows an SEM image of an a-SiGe layer partly shielded and exposed to a high laser fluence. The apparent change between the exposed 602 and unexposed 601 SiGe surface roughness is clearly visible. The surface roughness of the exposed poly-SiGe areas 602 is increased to 174 nm, similar to the value obtained previously for the 1.8 µm thick sample treated with the same fluence.

Further tests to the aluminum shielding layer itself showed that the surface roughness experienced almost no change. A blanket 1 µm Al layer was exposed to a harsh laser fluence of 960 mJ/cm², to examine the endurance of the layer to higher laser annealing conditions. The surface roughness of the layer started at a value of 30 nm pre-treatment and only increased to 31 nm post-treatment. In fact, to increase the surface roughness to 72 nm, 2400 pulses at the same laser fluence had to be applied. It was only after 6000 pulses that the roughness increased to 221 nm.

Figure 7:
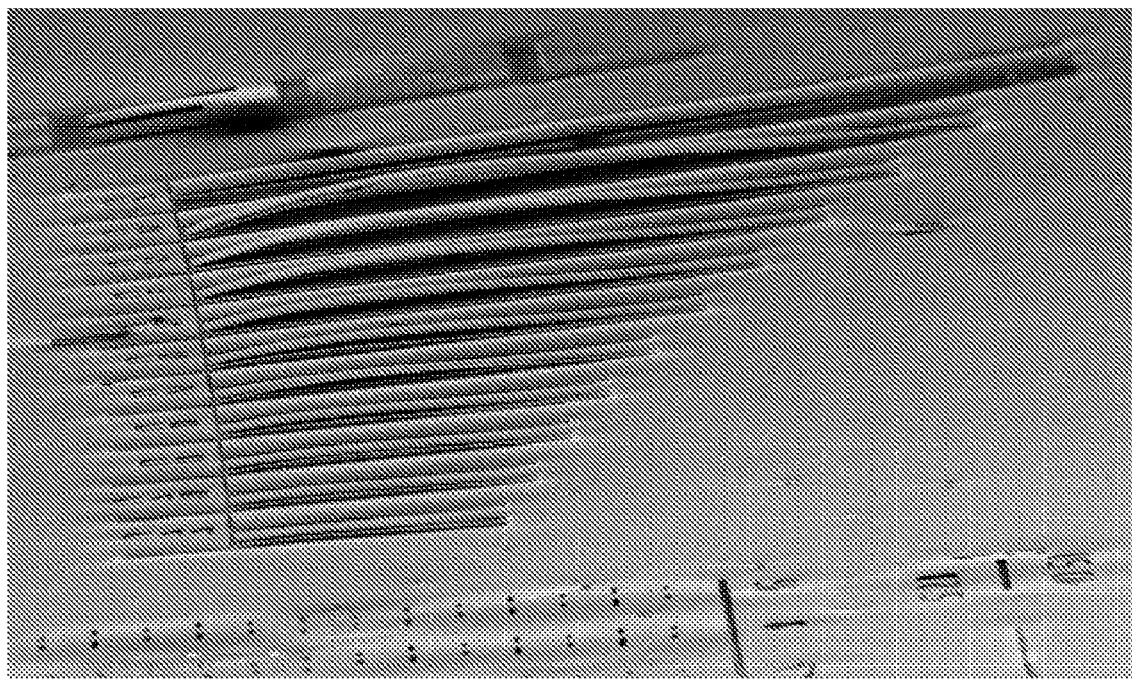
FIG. 7 shows a first secondary electron microscopy (SEM) image of released cantilevers in accordance with an embodiment.
Figure 8:
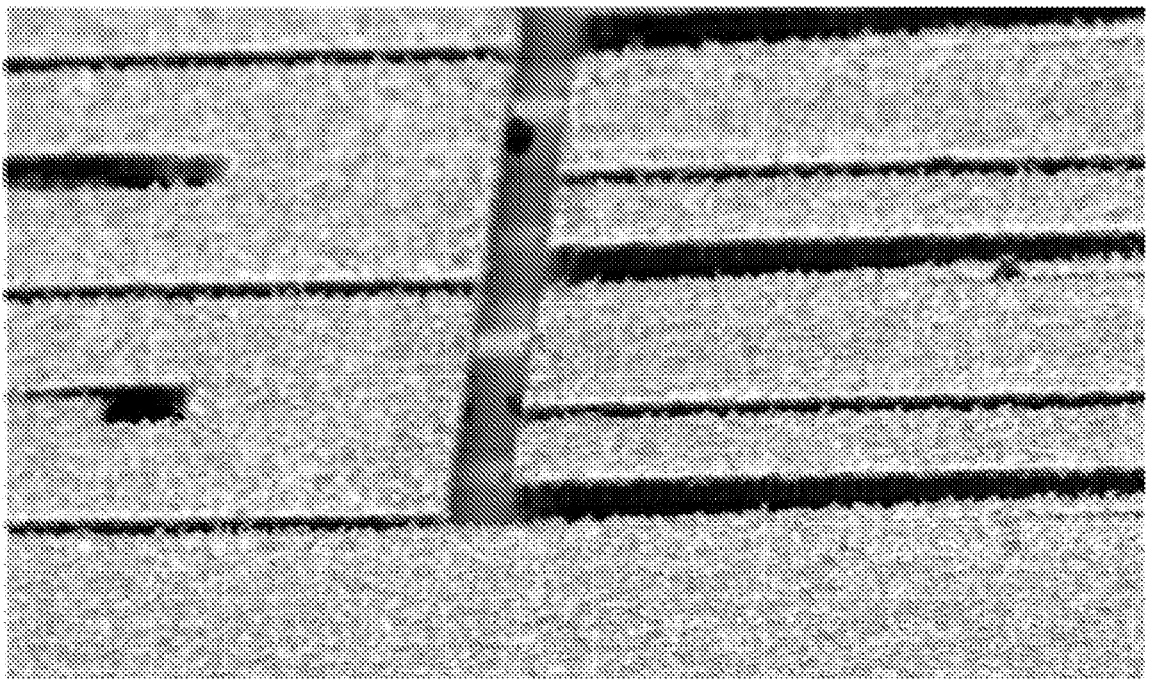
FIG. 8 shows a second SEM image of released cantilevers in accordance with an embodiment.

FIG. 7 shows an SEM image of released cantilevers before annealing, in accordance with an embodiment. FIG. 8 shows an SEM image of released cantilevers after annealing, in accordance with an embodiment. The anneal performed on the released cantilevers of FIG. 8 was an annealing treatment of 500 pulses at 10 Hz and 120 mJ/cm², which resulting in a reduced strain gradient.

Either a single or multiple pulse technique can be used to minimize the strain gradient. For a 1.8 µm thick $Si_{72}Ge_{28}$ film deposited at 210° C., 500 pulses at 10 Hz and 120 mJ/cm2 are sufficient to reduce the strain gradient to $-1.6\times10^{-7}$ µm$^{-1}$. However, a treatment at this laser fluence results in a moderate resistivity of 35.8 mΩ·cm. A limitation to ensure reduced strain gradient values is to keep the total supplied energy for a single pulse treatment below 240 mJ/cm². This will affect the maximum crystallization depth. Transmission electron microscopy (TEM) analysis shows that only a maximum crystallization depth of 0.2 µm is achieved for the 1.8 µm SiGe film annealed with 500 pulses at 10 Hz and 120 mJ/cm².

Figure 9:
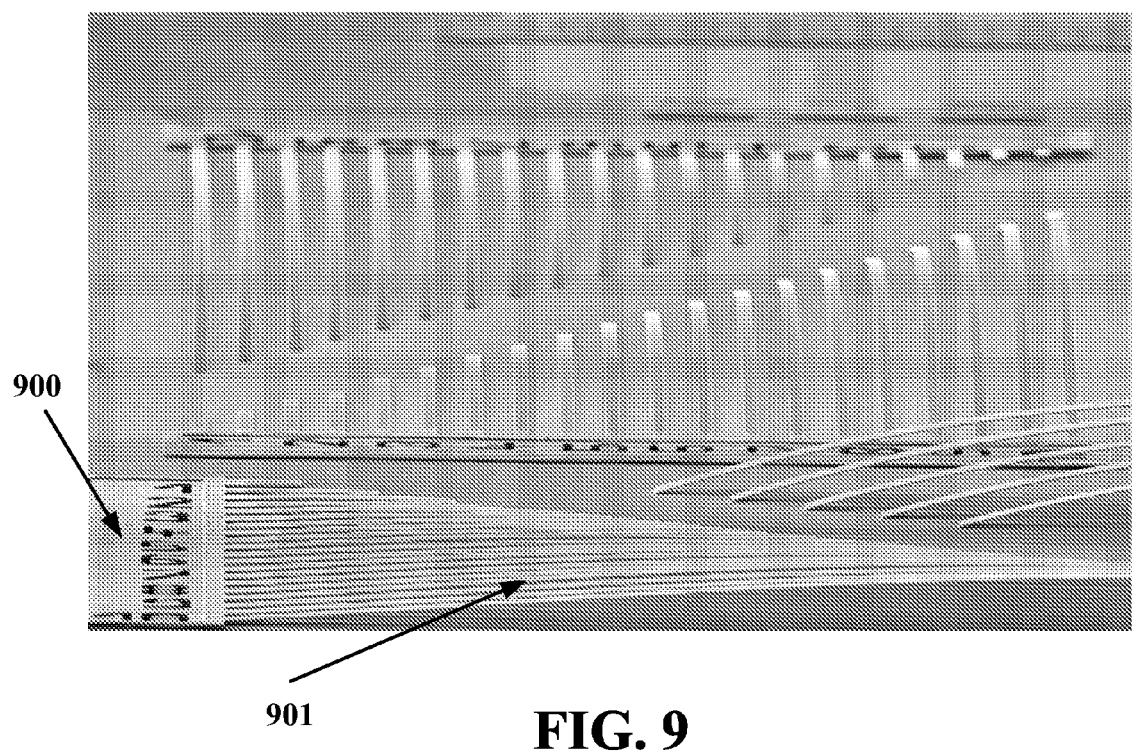
FIG. 9 shows a third SEM image of released cantilevers in accordance with an embodiment.

FIG. 9 shows an SEM image of released cantilevers in accordance with an embodiment. As shown, the suspended area 901 was shielded with an aluminum layer when applying a first laser anneal to contact area 900 of the series of cantilevers. A laser energy of 100 mJ was applied and it can be seen that the released cantilevers suffer from strain (bending cantilevers).

Figure 10:
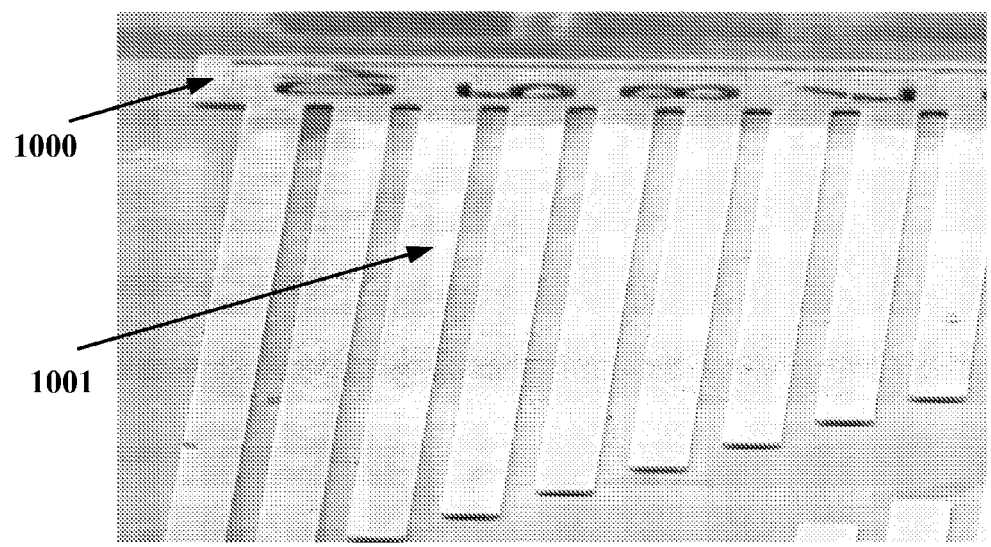
FIG. 10 shows a fourth SEM image of released cantilevers in accordance with an embodiment.

FIG. 10 shows an SEM image of released cantilevers in accordance with an embodiment. The suspended area 1001 was shielded with an aluminum layer when applying a first laser anneal to contact area 1000 of the series of cantilevers. A laser energy of 100 mJ was applied. Thereafter the aluminum layer was removed and a second laser anneal was applied to both the contact area 1000 and the suspended area 1001 of the series of cantilevers. The first anneal was a single pulse anneal of 100 mJ, whereas the second anneal was a pulsed anneal of 20 mJ and 1000 pulses at 20 Hz. It can be seen that the released cantilevers do not suffer from strain and are nicely released without any bending.

Embodiments of the present invention demonstrated the possibility to realize semiconductor films, in particular SiGe films, deposited at 210° C. with a low resistivity in the contact areas (down to 3.47 mΩ·cm) and a low strain gradient of $-1.6\times10^{-7}$ µm$^{-1}$ for the freestanding structures using a 2-step laser annealing process of which 1 step uses a patterned shielding layer, e.g. a patterned Al shielding layer. The Al shield is highly reflective to the UV radiation and no drastic changes are detected in the shield after laser anneal.

It is to be understood that although preferred embodiments, specific constructions and configurations, as well as materials, have been discussed herein for devices according to the present invention, various changes or modifications in form and detail may be made without departing from the scope and spirit of this invention. Functionality may be added or deleted from the block diagrams and operations may be interchanged among functional blocks. Steps may be added or deleted to methods described within the scope of the present invention.

What is claimed is:

1. A method comprising:
providing a structural layer comprising an amorphous semiconductor material;
forming a shielding layer on a first portion of the structural layer and leaving exposed a second portion of the structural layer;
annealing the second portion using a first fluence;
removing the shielding layer; and
annealing the first portion and the second portion using a second fluence, wherein the second fluence is less than half the first fluence.

2. The method of claim 1, wherein annealing the second portion using the first fluence comprises modifying an electrical resistivity of the second portion of the structural layer.

3. The method of claim 2, wherein before annealing the second portion using the first fluence the second portion has an initial electrical resistivity, and wherein modifying the electrical resistivity of the second portion comprises decreasing the electrical resistivity of the second portion from the initial resistivity to a predetermined resistivity.

4. The method of claim 3, wherein a difference between the initial resistivity and the predetermined resistivity is based at least in part on the first fluence.

5. The method of claim 1, wherein annealing the first portion and the second portion using the second fluence comprises modifying a strain gradient of the first portion.

6. The method of claim 5, wherein before annealing the first portion and the second portion using the second fluence the first portion has an initial strain gradient, and wherein modifying the strain gradient of the first portion comprises decreasing the strain gradient of the first portion from the initial strain gradient to a predetermined strain gradient.

7. The method of claim 6, wherein a difference between the initial strain gradient and the predetermined strain gradient is based at least in part on the second fluence.

8. The method of claim 1, wherein annealing the second portion using the first fluence comprises converting of at least part of the second portion from amorphous semiconductor material to crystalline semiconductor material.

9. The method of claim 8, wherein converting of at least part of the second portion from amorphous semiconductor material to crystalline semiconductor material comprises converting substantially all of the second portion from amorphous semiconductor material to crystalline semiconductor material.

10. The method of claim 1, wherein annealing the first portion and the second portion using the second fluence comprises converting of at least part of the first portion from amorphous semiconductor material to crystalline semiconductor material.

11. The method of claim 10, wherein converting of at least part of the first portion from amorphous semiconductor material to crystalline semiconductor material comprises converting at least an upper part of the first portion from amorphous semiconductor material to crystalline semiconductor material.

12. The method of claim 1, wherein providing a structural layer of amorphous semiconductor material is performed at temperature below 400 degrees Celsius.

13. The method of claim 1, wherein the shielding layer comprises a reflective material.

14. A method comprising:
providing a structural layer comprising an amorphous semiconductor material;
forming a shielding layer on a first portion of the structural layer and leaving exposed a second portion of the structural layer;
annealing the second portion using a first set of parameters including a first laser pulse fluence, thereby decreasing an electrical resistivity of the second portion;
removing the shielding layer; and
annealing at least the first portion using a second set of parameters including a second laser pulse fluence, thereby decreasing a strain gradient of the first portion.

15. The method of claim 14, wherein the first laser pulse fluence is greater than the second laser pulse fluence.

16. The method of claim 14, wherein the first set of parameters further includes a first number of laser pulses and a first pulse repetition rate, and wherein decreasing the electrical resistivity of the second portion comprises decreasing the electrical resistivity of the second portion by an amount that is based on at least one of the first laser pulse fluence, the first number of laser pulses, and the first pulse repetition rate.

17. The method of claim 14, wherein the second set of parameters further includes a second number of laser pulses and a second pulse repetition rate, and wherein decreasing the strain gradient of the first portion comprises decreasing the strain gradient of the first portion by an amount that is based on at least one of the second laser pulse fluence, the second number of laser pulses, and the second pulse repetition rate.

* * * * *